United States Patent
Takeuchi et al.

(10) Patent No.: US 9,969,651 B2
(45) Date of Patent: May 15, 2018

(54) PRECURSOR SOL-GEL SOLUTION, ELECTROMECHANICAL TRANSDUCER ELEMENT, LIQUID DROPLET DISCHARGE HEAD, AND INKJET RECORDING APPARATUS

(71) Applicants: Atsushi Takeuchi, Kanagawa (JP); Osamu Machida, Kanagawa (JP); Akira Shimofuku, Kanagawa (JP)

(72) Inventors: Atsushi Takeuchi, Kanagawa (JP); Osamu Machida, Kanagawa (JP); Akira Shimofuku, Kanagawa (JP)

(73) Assignee: Ricoh Company, Ltd., Tokyo (JP)

(*) Notice: Subject to any disclaimer, the term of this patent is extended or adjusted under 35 U.S.C. 154(b) by 0 days. days.

(21) Appl. No.: 15/695,769

(22) Filed: Sep. 5, 2017

(65) Prior Publication Data

US 2017/0362127 A1   Dec. 21, 2017

Related U.S. Application Data

(62) Division of application No. 14/689,138, filed on Apr. 17, 2015.

(30) Foreign Application Priority Data

Apr. 23, 2014   (JP) .................................. 2014-088836

(51) Int. Cl.
*H01L 41/187* (2006.01)
*C04B 35/472* (2006.01)
(Continued)

(52) U.S. Cl.
CPC ......... *C04B 35/472* (2013.01); *B41J 2/14233* (2013.01); *B41J 2/161* (2013.01);
(Continued)

(58) Field of Classification Search
CPC . H01L 41/318; H01L 41/331; H01L 41/1876; F04B 19/006; F04B 43/046;
(Continued)

(56) References Cited

U.S. PATENT DOCUMENTS 6,068,690 A * 5/2000 Aizawa ................ C01G 23/002
106/287.19
6,342,177 B1   1/2002 Kitaoka
(Continued)

FOREIGN PATENT DOCUMENTS

JP   H08-091841   4/1996
JP   H09-134613   5/1997
(Continued)

OTHER PUBLICATIONS

Japanese Office Action for 2014-088836 dated Feb. 6, 2018.

*Primary Examiner* — Thomas Dougherty
(74) *Attorney, Agent, or Firm* — IPUSA, PLLC

(57) ABSTRACT

A functional ink that includes a precursor sol-gel solution and a solvent is provided. The precursor sol-gel solution is used for forming an oxide dielectric film having a perovskite structure represented by a general formula $ABO_3$, and has been subjected to a partial hydrolysis process in which a viscosity change resulting from the partial hydrolysis process is controlled to be less than or equal to 50%, and water contained in the precursor sol-gel solution is controlled to be greater than or equal to 0.50 times and less than or equal to 10 times by molar ratio with respect to a B site atom contained in the precursor sol-gel solution. The functional ink has a metal oxide concentration and a viscosity that renders the functional ink suitable for being discharged from a nozzle of a liquid droplet discharge apparatus included in a thin film fabrication apparatus.

5 Claims, 13 Drawing Sheets

(51) Int. Cl.
*F04B 43/04* (2006.01)
*F04B 19/00* (2006.01)
*G02B 26/08* (2006.01)
*C23C 18/12* (2006.01)
*B41J 2/16* (2006.01)
*B41J 2/14* (2006.01)
*H01L 41/331* (2013.01)
*H01L 41/318* (2013.01)
*F16K 99/00* (2006.01)

(52) U.S. Cl.
CPC ........... *B41J 2/164* (2013.01); *C23C 18/1216* (2013.01); *C23C 18/1254* (2013.01); *C23C 18/1283* (2013.01); *F04B 19/006* (2013.01); *F04B 43/046* (2013.01); *F16K 99/0015* (2013.01); *F16K 99/0048* (2013.01); *G02B 26/0858* (2013.01); *H01L 41/1876* (2013.01); *H01L 41/318* (2013.01); *H01L 41/331* (2013.01); *F16K 2099/0092* (2013.01)

(58) Field of Classification Search
CPC ............. F16K 99/0015; F16K 99/0048; G02B 23/0858; C04B 35/472; B41J 2/14233; B41J 2/164; C23C 18/1216; C23C 18/1254; C23C 18/1283
USPC ........................................................ 310/358
See application file for complete search history.

(56) References Cited

U.S. PATENT DOCUMENTS

| | | | |
|---|---|---|---|
| 6,455,106 | B1 | 9/2002 | Qiu et al. |
| 6,589,457 | B1* | 7/2003 | Li ................. C23C 18/1216 216/56 |
| 6,593,149 | B2 | 7/2003 | Lee et al. |
| 7,279,823 | B2 | 10/2007 | Higuchi et al. |
| 8,690,297 | B2 | 4/2014 | Ueda et al. |
| 2006/0230476 | A1* | 10/2006 | Atanasoska ............. A61L 29/12 604/93.01 |
| 2015/0307403 | A1* | 10/2015 | Takeuchi ............. F04B 43/046 423/598 |

FOREIGN PATENT DOCUMENTS

| | | |
|---|---|---|
| JP | H11-286653 | 10/1999 |
| JP | 2000-034575 | 2/2000 |
| JP | 2000-058935 | 2/2000 |
| JP | 2000-091657 | 3/2000 |
| JP | 3953810 | 8/2007 |
| JP | 4432776 | 3/2010 |
| JP | 2010-219148 | 9/2010 |
| JP | 2011-155204 | 8/2011 |
| JP | 2013-225671 | 10/2013 |
| JP | 2014-030008 | 2/2014 |
| JP | 2015-005568 | 1/2015 |
| WO | 99/36353 | 7/1999 |

* cited by examiner

PRECURSOR SOL-GEL SOLUTION, ELECTROMECHANICAL TRANSDUCER ELEMENT, LIQUID DROPLET DISCHARGE HEAD, AND INKJET RECORDING APPARATUS

CROSS-REFERENCE TO RELATED APPLICATION

The present application is a divisional application and claims priority under 35 U.S.C. 120 to U.S. patent application Ser. No. 14/689,138 filed on Apr. 17, 2015, which claims priority under 35 U.S.C. 119 to Japanese Patent Application No. 2014-088836 filed on Apr. 23, 2014. The entire contents of the foregoing applications are incorporated herein by reference.

BACKGROUND OF THE INVENTION

1. Field of the Invention

The present invention relates to a precursor sol-gel solution, an electromechanical transducer element, a liquid droplet discharge head, and an inkjet recording apparatus.

2. Description of the Related Art

Image recording apparatuses, such as printers, facsimile machines, and copiers, or inkjet recording apparatuses and liquid droplet discharge heads used in image forming apparatuses may include nozzles that discharge ink droplets, pressurizing chambers that communicate with the nozzles, and electromechanical transducer elements such as piezoelectric elements that apply pressure to ink inside the pressurizing chambers.

The electromechanical transducer element may have a laminated structure in which an electromechanical transducer film and an upper electrode are laminated on a lower electrode, for example. The electromechanical transducer film corresponding to a thin film may be fabricated by a film forming technique such as the sputtering method, the MO-CVD method (chemical vapor deposition using a metal organic compound), the vacuum deposition method, the ion-plating method, the sol-gel method, or the aerosol deposition method, for example.

In the following, a method of fabricating an electromechanical transducer film using the sol-gel method is described as an example. First, a hydrophobic film pattern is formed on a lower electrode. A portion of the lower electrode on which the hydrophobic film pattern is not formed is hydrophilic. Next, a precursor coating film of the electromechanical transducer film is formed only on the hydrophilic portion of the lower electrode (portion on which the hydrophobic film pattern is not formed) and a heat treatment is performed. By performing the heat treatment, the hydrophobic film pattern disappears.

The precursor coating film may be formed by the inkjet method, for example. That is, by controlling tiny ink droplets discharged from an inkjet head to land directly onto the hydrophilic portion, the ink droplets may moisten and spread across the hydrophilic portion to form the precursor coating film. In the inkjet method, solidification of the solution within the inkjet head and precipitation of solids at the peripheral portion of the nozzle affect the landing pattern of the ink droplets, for example.

A method of fabricating a ferroelectric film with a large film thickness is known that involves thickening a solution containing an alkoxide of a metal element constituting a complex oxide ferroelectric by partial hydrolysis and forming the ferroelectric film in a single coating process (see e.g., Japanese Laid-Open Patent Publication No. 2010-219148).

Note that the quality of the electromechanical transducer film formed using the sol-gel method depends on the discharge reliability of the inkjet head for discharging ink droplets.

Discharge reliability is correlated with the amount of water (moisture) contained in the precursor sol-gel solution. For example, if the amount of water contained in the solution is too small, problems may arise such as deflection of droplets discharged from the inkjet head or blockage of the droplets to be discharged due to clogging of the solution at the nozzle.

That is, if the amount of water contained in the precursor sol-gel solution is not within a predetermined range, the discharge reliability of the inkjet head may be compromised, and the quality of the electromechanical transducer film may be degraded.

SUMMARY OF THE INVENTION

In view of the above problems of the related art, an aspect of the present invention is directed to providing a precursor sol-gel solution that may be used to form a high-quality electromechanical transducer film.

According to one embodiment of the present invention, a functional ink that includes a precursor sol-gel solution and a solvent is provided. The precursor sol-gel solution is used for forming an oxide dielectric film having a perovskite structure represented by a general formula $ABO_3$, and has been subjected to a partial hydrolysis process in which a viscosity change resulting from the partial hydrolysis process is controlled to be less than or equal to 50%, and the water contained in the precursor sol-gel solution is controlled to be greater than or equal to 0.50 times and less than or equal to 10 times by molar ratio with respect to the B site atom contained in the precursor sol-gel solution. The functional ink has a metal oxide concentration and a viscosity that renders the functional ink suitable for being discharged from a nozzle of a liquid droplet discharge apparatus included in a thin film fabrication apparatus.

DESCRIPTION OF THE PREFERRED EMBODIMENTS

Figure 1:
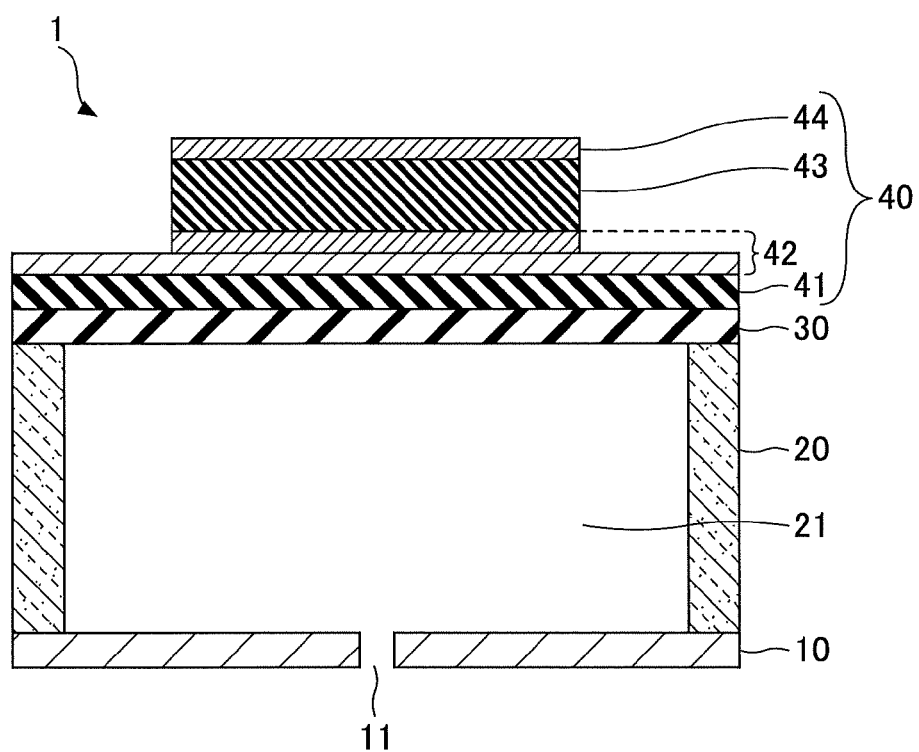
FIG. 1 is a cross-sectional view illustrating an example of a liquid droplet discharge head according to a first embodiment of the present invention.

In the following, embodiments of the present invention are described with reference to the accompanying drawings. Note that components illustrated in the drawings that have the same features are given the same reference numerals and overlapping descriptions thereof may be omitted.

First Embodiment

[Thin Film]

First, an electromechanical transducer film included in an electromechanical transducer element is described below as an example of a thin film fabricated by a thin film fabrication apparatus and a thin film fabrication method according to a first embodiment of the present invention. Note, however, that a thin film that can be fabricated by the thin film fabrication apparatus and the thin film fabrication method according to the first embodiment is not limited to such an electromechanical transducer film.

The electromechanical transducer element may be used as a component of a liquid droplet discharge head used in an inkjet recording apparatus, for example. FIG. 1 is a cross-sectional view illustrating an example of a liquid droplet discharge head 1 using an electromechanical transducer element.

Referring to FIG. 1, the liquid droplet discharge head 1 includes a nozzle plate 10, a pressure chamber substrate 20, an diaphragm plate 30, and an electromechanical transducer element 40. The nozzle plate 10 has a nozzle 11 formed therein for discharging ink droplets. A pressure chamber 21 (also referred to as "ink flow path", "pressurized liquid chamber", "pressurizing chamber", "discharge chamber", "liquid chamber", etc.) that communicates with the nozzle 11 is formed by the nozzle plate 10, the pressure chamber substrate 20, and the diaphragm plate 30. The diaphragm plate 30 forms a part of a wall of the ink flow path.

The electromechanical transducer element 40 includes an adhesion layer 41, a lower electrode 42, an electromechanical transducer film 43, and an upper electrode 44. The electromechanical transducer element 40 has a function of pressurizing ink within the pressure chamber 21. The adhesion layer 41 may be made of Ti, $TiO_2$, TiN, Ta, $Ta_2O_5$, or $Ta_3N_5$, for example, and is configured to improve the adhesion between the lower electrode 42 and the diaphragm plate 30. Note, however, that the adhesion layer 41 is not an essential component of an electromechanical transducer element 40.

In the electromechanical transducer element 40, when a voltage is applied between the lower electrode 42 and the upper electrode 44, the electromechanical transducer film 43 is mechanically displaced. With the mechanical displacement of the electromechanical transducer film 43, the diaphragm plate 30 may be displaced, for example, in the transverse direction (d31 direction) to pressurize the ink within the pressure chamber 21. In this way, ink droplets may be discharged from the nozzle 11.

Figure 2:
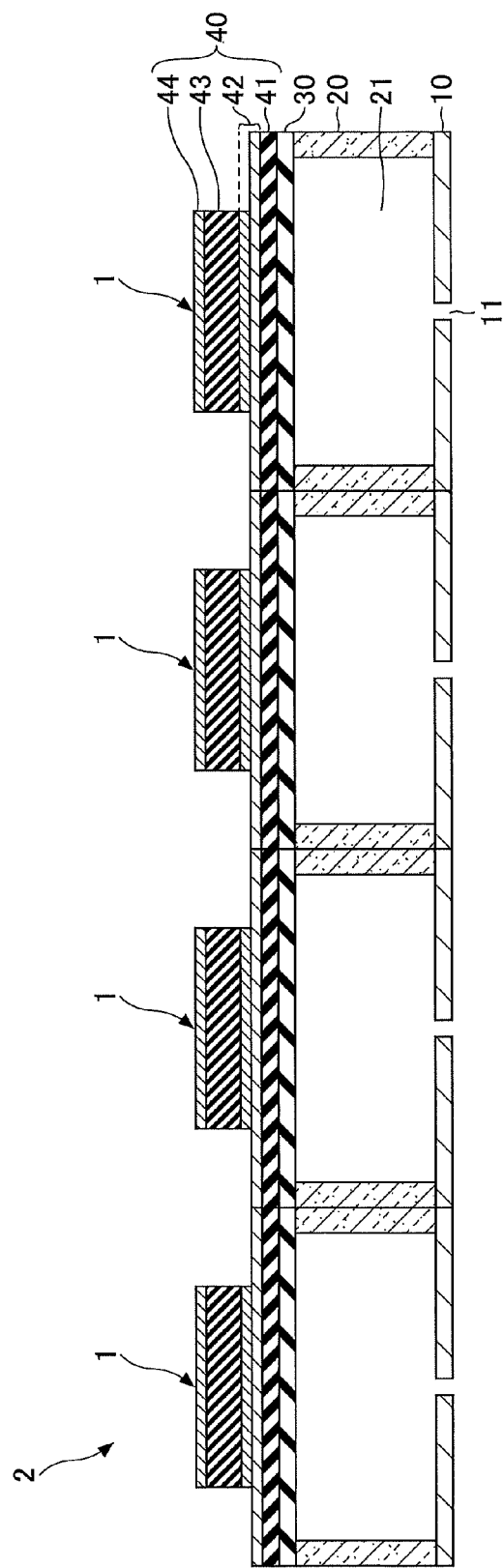
FIG. 2 is a cross-sectional view illustrating another example of a liquid droplet discharge head according to the first embodiment.

As illustrated in FIG. 2, a liquid discharge head 2 may be configured by arranging a plurality of the liquid droplet discharge heads 1 next to one another, for example.

Note that PZT may be used as the material of the electromechanical transducer film 43, for example. PZT is a solid solution of lead zirconate ($PbZrO_3$) and lead titanate ($PbTiO_3$). For example, PZT with a $PbZrO_3$ to $PbTiO_3$ ratio of 53:47, which is represented by the chemical formula $Pb(Zr_{0.53},Ti_{0.47})O_3$, and is generally referred to as PZT(53/47), may be used. The characteristics of PZT vary depending on the $PbZrO_3$ to $PbTiO_3$ ratio.

In the case of using PZT as the electromechanical transducer film 43, a lead acetate hydrate, a zirconium alkoxide compound, and a titanium alkoxide compound are used as starting materials that are dissolved in 2-methoxyethanol as a common solvent, and a PZT precursor sol-gel solution is prepared. The mix ratio of the lead acetate hydrate, the zirconium alkoxide compound, and the titanium alkoxide compound may be suitably selected by persons skilled in the art according to the desired composition of PZT ($PbZrO_3$ to $PbTiO_3$ ratio).

Note that metal alkoxide compounds are easily decomposed by moisture in the atmosphere. Therefore, acetylacetone, acetic acid, diethanolamine and the like may be added as stabilizers to the PZT precursor sol-gel solution. These materials may be added also for the purpose of suppressing a viscosity increase in a partial hydrolysis process step described below.

Note that barium titanate may be used as the material of the electromechanical transducer film 43 as well, for example. In this case, a barium alkoxide compound and a titanium alkoxide compound are used as starting materials that are dissolved in a common solvent to produce a barium titanate precursor sol-gel solution. Also, for example, a solid solution of barium titanate and bismuth perovskite may be used as well.

These materials are composite oxides represented by the general formula $ABO_3$ that include A site atoms and B site atoms as main components, where A=Pb, Ba, Sr, Bi and B=Ti, Zr, Sn, Ni, Zn, Mg, Nb. These materials may be specifically described as $(Pb_{1-x}, Ba)(Zr, Ti))O_3$, or $(Pb_{1-x}, Sr)(Zr,Ti)O_3$, for example, which represent cases where a part of Pb of the A site is replaced by Ba or Sr. Such replacements are possible for divalent elements, and they exhibit the effect of reducing characteristic deterioration due to evaporation of lead during a thermal process.

In forming the electromechanical transducer film 43, regardless of the specific materials of the above-described materials that are used, a partial hydrolysis step is preferably performed to control the amount of water (moisture) contained in the precursor sol-gel solution to be greater than or equal to 0.50 times and less than or equal to 10 times by molar ratio with respect to the B site atoms contained in the precursor sol-gel solution. In the partial hydrolysis step, water or an aqueous solution is added to the precursor sol-gel solution. In this case, a stabilization process is preferably implemented such that a viscosity increase due to the partial hydrolysis step may be controlled to be less than or equal to 50%.

Although the underlying mechanisms of solution clogging and droplet deflection occurring at a nozzle of a liquid discharge head used in an inkjet recording apparatus are not clear, it is believed that phenomena such as solvent drying and solidification of solids in the precursor sol-gel solution at the nozzle are the likely causes.

In general, moisture is included in the atmosphere. When the moisture in the atmosphere comes into contact with the precursor sol-gel solution (e.g. PZT precursor sol-gel solution) in the vicinity of the nozzle, hydrolysis and polycondensation reactions occur at the outermost surface of the solution. That is, in the precursor sol-gel solution, the rate of a diffusion reaction, and the rate of hydrolysis and polycondensation reactions presumably depend on the amount of water (moisture) contained in the precursor sol-gel solution.

For example, if the amount of water in the precursor sol-gel solution is sufficiently large (greater than or equal to 0.50 times and less than or equal to 10 times the B site atoms), hydrolysis and polycondensation reactions are adequately promoted such that a sufficiently high degree of polymerization is achieved and the number of molecules to be newly polymerized is reduced.

As a result, the rate of hydrolysis and polycondensation reactions in the vicinity of the nozzle becomes lower, and a diffusion reaction occurs more easily as compared to the hydrolysis and polycondensation reactions. That is, the solid content of the precursor sol-gel solution becomes less likely to be precipitated in the vicinity of the nozzle, and in this way, an electromechanical transducer film with a uniform film thickness and desirable electrical characteristics can be easily obtained.

For example, if the amount of water contained in the precursor sol-gel solution is small (less than 0.50 times), hydrolysis and polycondensation reactions are not adequately promoted such that the degree of polymerization is low and there may be a large number of molecules to be newly polymerized.

As a result, the rate of hydrolysis and polycondensation reactions in the vicinity of the nozzle may be accelerated such that the hydrolysis and polycondensation reactions occur more easily as compared to the diffusion reaction. During continuous discharge, liquid droplets are discharged from the nozzle more than a few thousand times per second. Thus, hydrolysis and polycondensation reactions may progress rapidly during continuous discharge, thereby causing the gelation of the solid content of the precursor sol-gel solution in the vicinity of the nozzle. With every discharge, small amounts of gel gradually grow and precipitate in the vicinity of the nozzle, and as a result, droplet deflection and solution clogging at the nozzle may be more likely to occur, for example.

Note that if the amount of water in the precursor sol-gel solution is too large (more than 10 times), hydrolysis and polycondensation reactions occur even when the solution is merely stored. Thus, such a solution is not practical in view of its poor storage stability. In this case, it is difficult to maintain the solution at a desirable viscosity for discharging the solution from the nozzle.

Therefore, as described in detail below, by using a precursor sol-gel solution containing water within the predetermined range, the discharge reliability of the inkjet head may be improved. As a result, fabrication of a high-quality electromechanical transducer film may be facilitated.

The lower electrode 42 may be made of a metal material having a high heat resistance for forming a SAM (Self Assembled Monolayer) film by reacting with an alkanethiol as described below. Specifically, for example, a platinum group metal having low reactivity such as ruthenium (Ru), rhodium (Rh), palladium (Pd), osmium (Os), iridium (Ir), or platinum (Pt), or an alloy material containing one or more of these platinum group metals may be used.

Also, after fabricating a metal layer, a conductive oxide layer may be laminated. The conductive oxide used for the conductive oxide layer may be a composite oxide represented by the general chemical formula $ABO_3$ that contains A and B as main components, where A=Sr, Ba, Ca, La, and B=Ru, Co, Ni. Specific examples include $SrRuO_3$, $CaRuO_3$, a solid solution containing these materials that may be represented as $(Sr_{1-x}Ca_x)O_3$, $LaNiO_3$, $SrCoO_3$, and a solid solution containing these materials that may be represented as $(La,Sr)(Ni_{1-y}Co_y)O_3$ (where y may be 1). Other examples of oxide materials that may be used include $IrO_2$, $RuO_2$, and the like.

The lower electrode 42 may be fabricated by a vacuum film formation method such as sputtering or vacuum deposition, for example. The lower electrode 42 establishes electrical connection as a common electrode when a signal is input to the electromechanical transducer element 40, and as such, the diaphragm plate 30 that is arranged below the electromechanical transducer element 40 may be made of an insulator or a conductor having an insulation film arranged on its surface by an insulation process.

As one specific example, the material used for the diaphragm plate 30 may be silicon. Also, in the case where the surface of the diaphragm plate 30 (substrate 31, which is described below) is subjected to an insulation process, for example, a silicon-based insulation film having a film thickness of approximately several hundred nanometers (nm) to several micrometers (μm) may be formed by a silicon oxide film, a silicon nitride film, a silicon oxynitride film, or a laminated film including more than one of these films. Also, in consideration of the difference in thermal expansion, a ceramic film such as an aluminum oxide film or a zirconia film may be used. The silicon-based insulation film may be formed on the surface of the diaphragm plate 30 by CVD or thermal oxidation of silicon, for example. The metal oxide film such as the aluminum oxide film may be formed on the surface of the diaphragm plate 30 by sputtering, for example.

[Thin Film Fabrication Apparatus]

Figure 3:
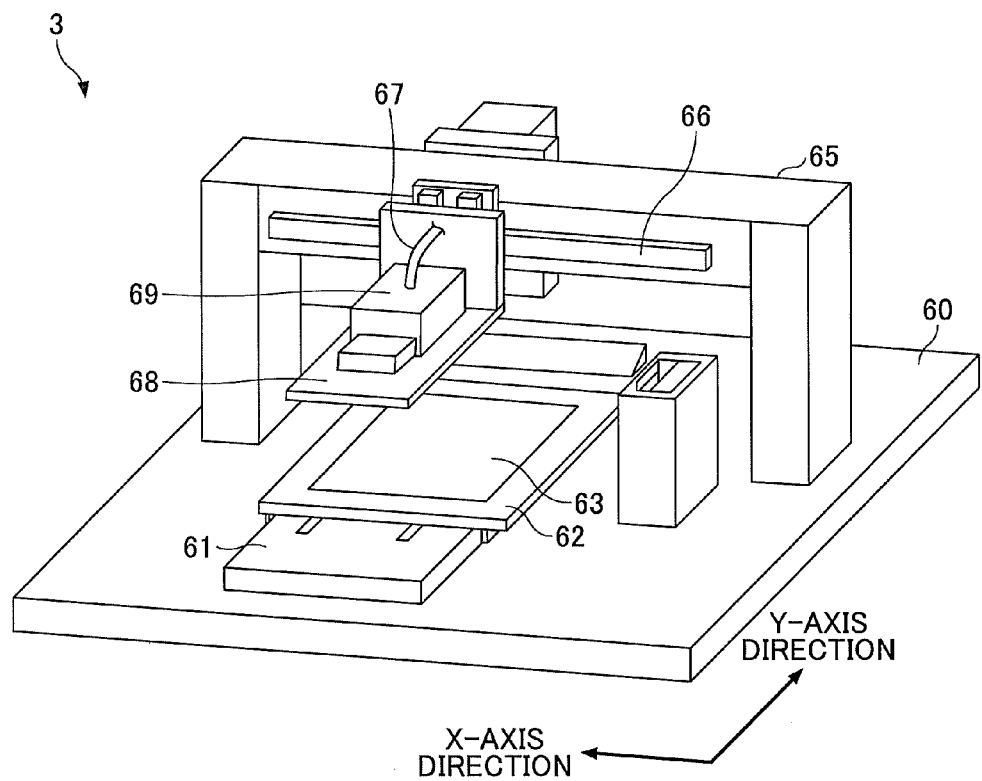
FIG. 3 is a perspective view of a thin film fabrication apparatus according to the first embodiment.

In the following, an exemplary structure of a thin film fabrication apparatus according to the first embodiment is described. FIG. 3 is a perspective view illustrating a thin film fabrication apparatus according to the first embodiment. Referring to FIG. 3, a thin film fabrication apparatus 3 has a Y-axis drive unit 61 arranged on a platform 60. A stage 62 for holding a substrate 63 is arranged on the Y-axis drive unit 61 such that the stage 62 may be driven in the Y-axis direction.

Note that an adsorption unit (not shown) using vacuum, static electricity, or the like is usually arranged at the stage 62 to fix the substrate 63 in place.

Also, an X-axis supporting member 65 for supporting an X-axis drive unit 66 is arranged on the platform 60. A head base 68 is arranged on the X-axis drive unit 66 such that the head base 68 may be driven in the X-axis direction. An inkjet head 69 for discharging functional ink is arranged on the head base 68. Functional ink is supplied to the inkjet head 69 from an ink tank (not shown) via a functional ink material supply pipe 67.

Note that in FIG. 3, the stage 62 has one degree of freedom in the Y-axis direction, and the inkjet head 69 has one degree of freedom in the X-axis direction. However, the present invention is not limited to such an arrangement. For example, the stage 62 may have two degrees of freedom in the X-axis and the Y-axis directions, and the ink jet head 69 may be fixed. Also, the stage 62 may have one degree of freedom in the Y-axis direction, and the inkjet head 69 may be aligned in the Y-axis direction, for example.

Also, the substrate 63 may be fixed, and the inkjet head 69 may be configured to have two degrees of freedom in the X-axis and Y-axis directions. Also, note that the X-axis and the Y-axis do not necessarily have to be perpendicular to each other as long as the X-axis vector and the Y-axis vector can represent one plane. For example, the X-axis vector and the Y-axis vector may form a 30-degree angle, a 45-degree angle, or a 60-degree angle.

The thin film fabrication apparatus 3 has an apparatus control unit (not shown) that can control the discharge conditions of the functional ink discharged from the inkjet head 69. The apparatus control unit includes a recording unit (not shown), and the state of the functional ink may be recorded in the recording unit, for example.

[Thin Film Fabrication Method]

In the following, a thin film fabrication method according to the first embodiment is described. Herein, a method of fabricating the electromechanical transducer film 43 illustrated in FIG. 1 is described as an example of a thin film fabrication method.

Figure 4A:
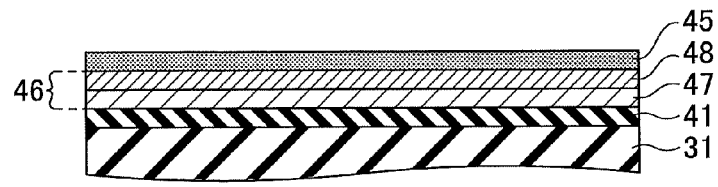
FIGS. 4A-4D illustrate a thin film fabrication process according to the first embodiment.

First, in a step shown in FIG. 4A, the adhesion layer 41, a lower electrode layer 46, and a photoresist layer 45 are sequentially stacked on the surface of the substrate 31. The lower electrode layer 46 is made of two layers including, for example, a platinum (Pt) layer as a lower layer electrode 47 and a strontium ruthenium oxide (SrRuO3) layer as an upper layer electrode 48.

Figure 4B:
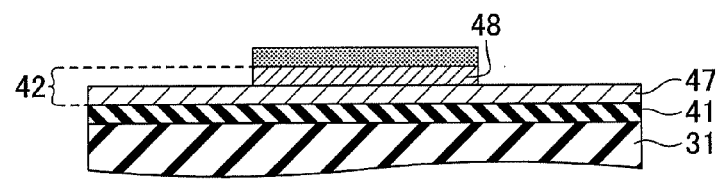

Next, in a step shown in FIG. 4B, a known photolithography method is used to pattern the photoresist layer 45 to form a resist pattern. The upper layer electrode 48 of the lower electrode layer 46 that does not overlap with the resist pattern is removed by dry etching to expose a portion of the surface of the lower layer electrode 47 of the lower electrode layer 46. The resist pattern is formed to match the layout of the pressure chamber 21 illustrated in FIG. 1.

Figure 4C:
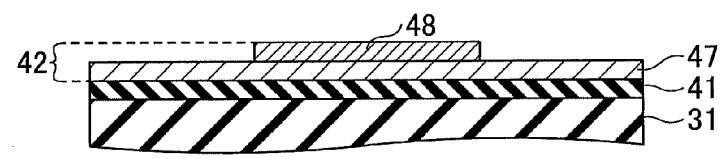

Next, in a step shown in FIG. 4C, the remaining resist pattern is removed. In this way, a lower electrode 42 including the upper layer electrode 48 that is arranged into a predetermined pattern on the lower electrode 47 may be fabricated.

Figure 4D:
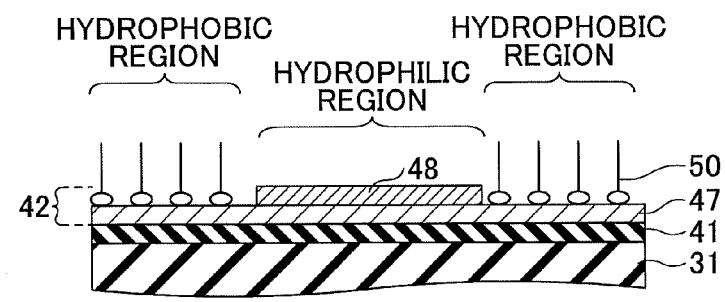

Next, in a step shown in FIG. 4D, a surface treatment is performed on the entire surface of the substrate on which the lower electrode 42 is formed, and a SAM (Self Assembled Monolayer) film 50 is formed on the surface of the lower layer electrode 47.

Specifically, the substrate on which the lower electrode 42 is formed is immersed in an SAM material made of an alkanethiol, for example. By having the SAM material react with the lower electrode 47 surface to cause the deposition of the SAM film 50, the lower layer electrode 47 surface may become a water-repellent surface. Although the reactivity and hydrophobicity (water repellency) of alkanethiols vary depending on the molecular chain length, typically, a solution is prepared by dissolving alkanethiol molecules having 6 to 18 carbon atoms in an organic solvent such as alcohol, acetone, or toluene. Normally, the concentration of the alkanethiol is arranged to be about several mmol/liter. After a predetermined time period, the substrate is taken out, excess molecules are washed and replaced with solvent, and the substrate is dried.

The region where the SAM film 50 is formed corresponds to a hydrophobic region. On the other hand, the region where the upper electrode 48 surface is exposed corresponds to a hydrophilic region. Using the contrast in the surface energy of these regions, functional ink 51 may be discretely applied as described in detail below.

Figure 5A:
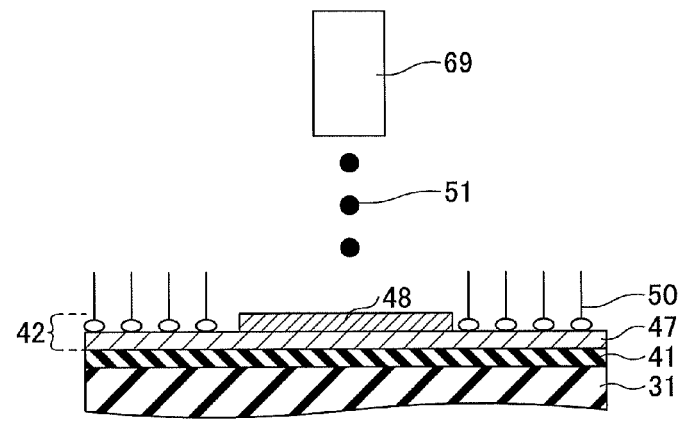
FIGS. 5A-5C illustrate the thin film fabrication process according to the first embodiment.

Then, in a step shown in FIG. 5A, the substrate that has been subjected to a surface treatment (corresponding to the substrate of FIG. 4D) is placed on the stage 62 of the thin film fabrication apparatus 3. Then, using a known alignment device (CCD camera, CMOS camera, etc.), the position and inclination of the substrate are aligned.

Then, the inkjet head 69 is driven in the X-axis direction and the stage 62 having the substrate placed thereon is driven in the Y-axis direction so that the inkjet head 69 may be positioned above the stage 62. Then, the functional ink 51 is discharged from the inkjet head 69 onto the hydrophilic region.

The functional ink 51 is a solution prepared by adjusting the precursor sol-gel solution into an ink solution. The amount of water (moisture) contained in the precursor sol-gel solution is controlled to be within a range of 0.50 times to 10 times by molar ratio with respect to the B site atoms contained in the precursor sol-gel solution. Note that in some preferred embodiments, this range may be further narrowed.

Figure 5B:
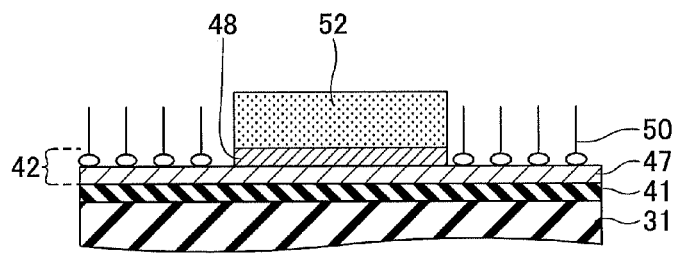

Next, in a step shown in FIG. 5B, a functional ink film 52 is formed in the hydrophilic region. Note that owing to the contrast in surface energy, the functional ink 51 only moistens and spreads across the hydrophilic region.

Figure 5C:
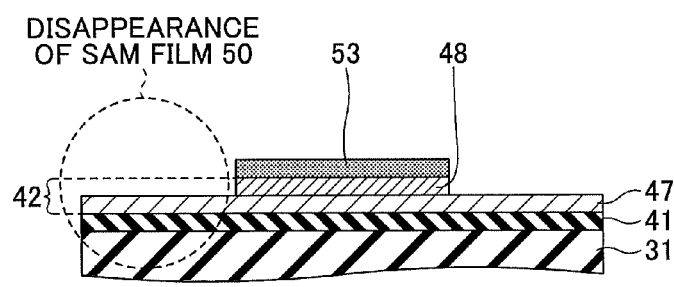

Next, in a step shown in FIG. 5C, a heat treatment is performed on the functional ink film 52, and a heat-treated functional ink film 53 is formed. That is, in a first heat treatment, the solvent of the functional ink film 52 is evaporated, and in a second heat treatment, an organic substance contained in the functional ink film 52 is thermally decomposed. Note that by performing the above heat treatment, the SAM film 50 disappears.

Figure 6A:
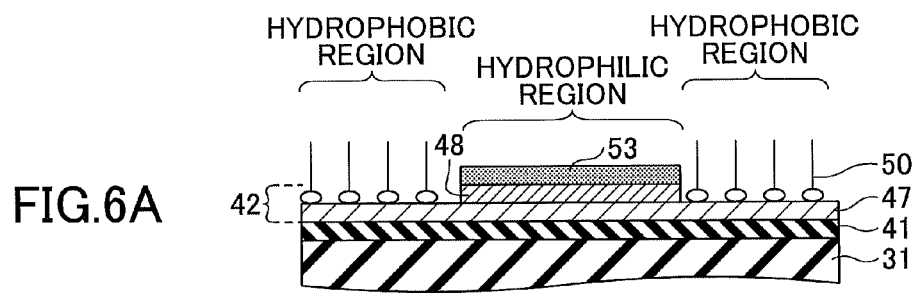
FIGS. 6A-6D illustrate the thin film fabrication process according to the first embodiment.

Next, in a step shown in FIG. 6A, the substrate from which the SAM film 50 has disappeared is washed with isopropyl alcohol. Then, the SAM film 50 is formed on the lower layer electrode 47 surface again in a manner similar to the step illustrated in FIG. 4D.

Figure 6B:

Next, in a step shown in FIG. 6B, the functional ink 51 is discharged from the inkjet head 69 onto the surface of the heat-treated functional ink film 53 (hydrophilic region) again in a manner similar to the step illustrated in FIG. 5A.

Figure 6C:
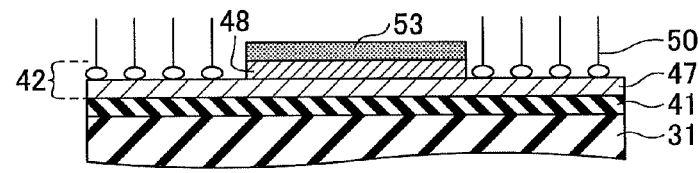

Next, in a step shown in FIG. 6C, the functional ink film 52 is formed on the heat-treated functional ink film 53 surface (hydrophilic region) again in a manner similar to the step illustrated in FIG. 5B. Owing to the contrast in surface energy, the functional ink 51 only moistens and spreads across the hydrophilic region.

Figure 6D:
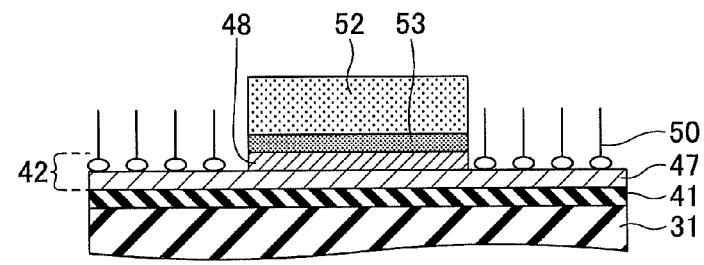

Next, in a step shown in FIG. 6D, a heat treatment is performed on the functional ink film 52 again in a manner similar to the step illustrated in FIG. 5C. That is, in the first heat treatment, the solvent in the functional ink film 52 is evaporated, and in the second heat treatment, the organic substance contained in the functional ink film 52 is thermally decomposed.

Further, in a third heat treatment, the heat-treated functional ink film 53 is crystallized to form a crystallized functional ink film 54.

The film thickness of the crystallized functional ink film 54 formed in the step of FIG. 6D is about several 10 nm. Such a film thickness is not sufficient for an electromechanical transducer film, and accordingly, after performing the step of FIG. 6D, the steps of FIG. 4D to FIG. 6C are repeated as is necessary. In this way, multiple layers of the crystallized functional ink film 54 may be stacked one on top of the other, and a crystallized functional ink film having a predetermined pattern and thickness (preferably less than or equal to 100 μm) corresponding to the electromechanical transducer film 43 may be fabricated on the lower layer electrode 42.

The electromechanical transducer film 43 fabricated according to the above-described thin film fabrication method may have a desirably high quality.

Second Embodiment

Figure 7:
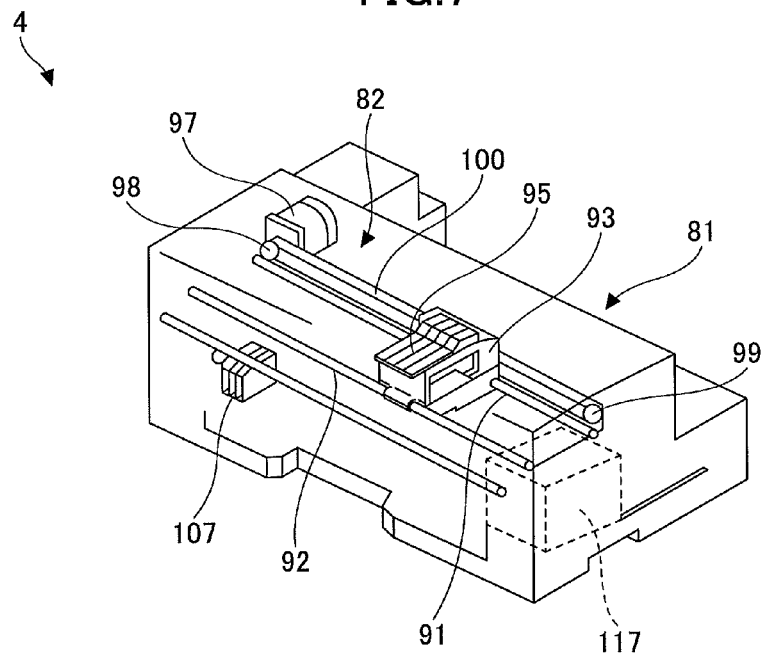
FIG. 7 is a perspective view illustrating an example of an inkjet head according to a second embodiment of the present invention.
Figure 8:
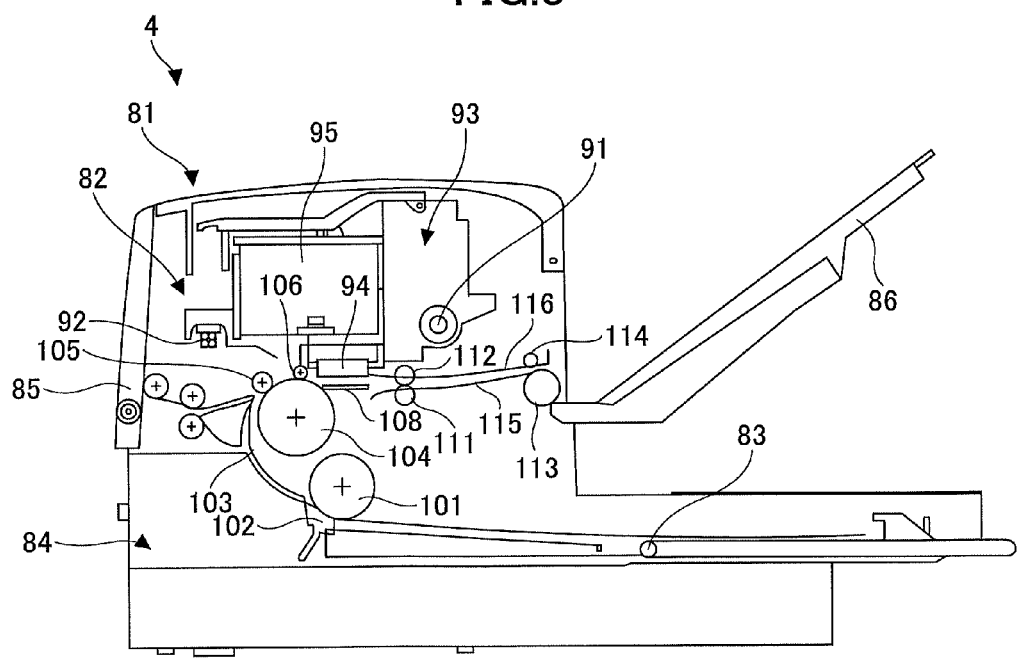
FIG. 8 is a side view illustrating a mechanism of the inkjet recording apparatus according to the second embodiment.

As a second embodiment of the present invention, an example of an inkjet recording apparatus including the liquid droplet discharge head 1 (see FIG. 1) fabricated by the thin film fabrication apparatus 3 is described. FIG. 7 is a perspective view illustrating an inkjet recording apparatus 4 according to the second embodiment. FIG. 8 is a side view illustrating a mechanism of the inkjet recording apparatus.

With reference to FIGS. 7 and 8, the ink jet recording unit 4 includes a recording apparatus main body 81 that accommodates a carriage 93 that is movable in a main scanning direction, an inkjet recording head 94 corresponding to an embodiment of the liquid discharge head 1 that is installed in the carriage 93, and a printing mechanism 82 including an ink supply cartridge 95 for supplying ink to the inkjet recording head 94.

A paper feed cassette 84 (or a paper feed tray) in which multiple sheets of paper 83 may be stacked may be detachably mounted to the lower part of the recording apparatus main body 81. Also, a manual feed tray 85 may be unfolded and opened to enable manual feeding of the paper sheet 83. The sheet of paper 83 that is fed via the paper feed cassette 84 or the manual feed tray 85 is introduced into the printing mechanism 82, and after an appropriate image is recorded on the paper 83 by the printing mechanism 82, the paper 83 is discharged to a discharge tray 86 that is mounted to a rear side.

The printing mechanism 82 includes a main guide rod 91 and a sub guide rod 92 that slidably hold the carriage 93 so that the carriage 93 may freely move in the main scanning direction. The main guide rod 91 and the sub guide rod 92 are horizontally supported by left and right side plates (not shown). The carriage 93 has a plurality of the inkjet recording heads 94 mounted thereto. Here, the inkjet recording heads 94 may be configured to discharge yellow (Y) ink droplets, cyan (C) ink droplets, magenta (M) ink droplets, and black (Bk) ink droplets. Plural ink discharge ports (nozzles) of the inkjet recording heads 94 are arranged in a direction intersecting the main scanning direction. The inkjet recording heads 94 are mounted to the carriage 93 so that the ink discharging direction is directed downward. Also, ink cartridges 95 for supplying the yellow ink, the cyan ink, the magenta ink, and the black ink to the corresponding inkjet recording heads 94 are exchangeably mounted to the carriage 93.

The ink cartridge 95 has an air inlet (not shown) that communicates with the outside air arranged at its upper side, a supply port (not shown) for supplying the corresponding ink to the inkjet recording head 94 arranged at its lower side, and a porous body (not shown) filled with the corresponding ink arranged in its interior. The pressure of the ink supplied to the inkjet recording heads 94 is kept slightly negative by the capillary force of the porous body. Note that although multiple heads that are configured to discharge the different colors of ink are utilized as the inkjet recording heads 94 in the present example, in other examples, a single head including nozzles for discharging the different colors of ink may be utilized.

A paper conveying direction downstream side of the carriage 92 is slidably supported by the main guide rod 91, and a paper conveying direction upstream side of the carriage 93 is slidably mounted on the sub guide rod 92. In order to move the carriage in the main scanning direction, a timing belt 100 is wound around a drive pulley 98 and a driven pulley 99. The drive pulley 98 is rotationally driven by a main scanning motor 97. The carriage 93 can be reciprocated by the forward and reverse rotations of the main scanning motor 97. The timing belt 100 is fixed to the carriage 93.

Further, the inkjet recording apparatus 4 includes a paper feeding roller 101 and a friction pad 102 for feeding the sheets of paper 83 from the paper feed cassette 84 and for separating the sheets of the paper 83, a guide member 103 for guiding the sheet of paper 83, a conveyance roller 104 that inverts the sheet of paper 83 being fed and conveys the sheet of paper 83, a pressing roller 105 that is pressed to a peripheral surface of the conveyance roller 104, and a top end roller 106 that defines an angle at which the sheet of paper 83 is sent from the conveyance roller 104. In this way, the sheet of paper 83 loaded in the paper feed cassette 84 may be conveyed to an area below the inkjet recording heads 94. The conveyance roller 104 is rotationally driven by a sub-scanning motor 107 via a sequence of gears.

Further, a print support member 109 for guiding the sheet of paper 83 sent out from the conveyance roller 104 at the area below the inkjet recording heads 94 is provided. The length of the print support member 109 corresponds to a moving range of the carriage 93 in the main scanning direction. Further, at the paper conveying direction downstream side of the print support member 109, a conveyance roller 111 and a spur 112 that are rotationally driven to send the sheet of paper 83 in a paper discharging direction are provided. Further, a paper eject roller 113 and a spur 114 for sending the sheet of paper 83 onto the paper discharge tray 86, and guide members 115 and 116 that form a paper ejection path are provided.

Upon recording an image, the inkjet recording apparatus 4 drives the inkjet recording heads 94 according to an image signal while moving the carriage 93. In this manner, the inkjet recording heads 94 discharge ink onto the sheet of paper 83 that is held at a standstill and thereby records one line of the image. Then, the inkjet recording apparatus 4 conveys the sheet of paper 83 by a predetermined distance and prints the next line. When the inkjet recording apparatus 4 receives a recording completion signal or a signal indicating that the end of the sheet of paper 83 has reached the printing area, the inkjet recording apparatus 4 terminates the recording operation and ejects the sheet of paper 83.

Further, the inkjet recording apparatus 4 includes a recovering device 117 for recovering the discharge performance of the inkjet recording heads 94. The recovering device 117 is disposed at a position outside the printing area. The recovering device 117 includes a cap unit, a suction unit, and a cleaning unit. While the inkjet recording apparatus 4 is in standby mode, the carriage 93 is moved to the side of the recovering device 117, and the inkjet recording heads 94 are capped by the cap unit. In this way, moistness may be maintained at the discharge ports of the inkjet recording heads 94, and discharge failure caused by ink drying may be prevented. Also, during recording, the inkjet recording apparatus 4 may have the inkjet recording heads 94 discharge ink that is not related to the recording operation. In this way, ink viscosities at all the discharge ports may be kept constant, and a stable discharging performance may be maintained.

When discharge failure occurs, the inkjet recording apparatus 4 seals the discharge ports of the inkjet recording heads 94 with the cap unit. Then, the suction unit sucks out ink along with air bubbles from the discharge ports via a tube. The cleaning unit removes ink or dust attached to the surface of the discharge ports. In this way, recovery operations for discharge failure may be performed. The ink sucked out of the inkjet recording heads 94 is discharged to a waste ink reservoir (not shown) disposed at a lower portion of the recording apparatus main body, and such ink is absorbed by an ink absorber within the waste ink reservoir.

As described above, because the inkjet recording apparatus 4 includes the inkjet recording heads 94 corresponding to an embodiment of the liquid discharge head 1 fabricated by the thin film fabrication apparatus 3, ink discharge failure caused by a drive failure of the diaphragm plate 30 may be prevented. In this way, stable ink discharge characteristics may be obtained and image quality may be improved.

Third Embodiment

Figure 9:
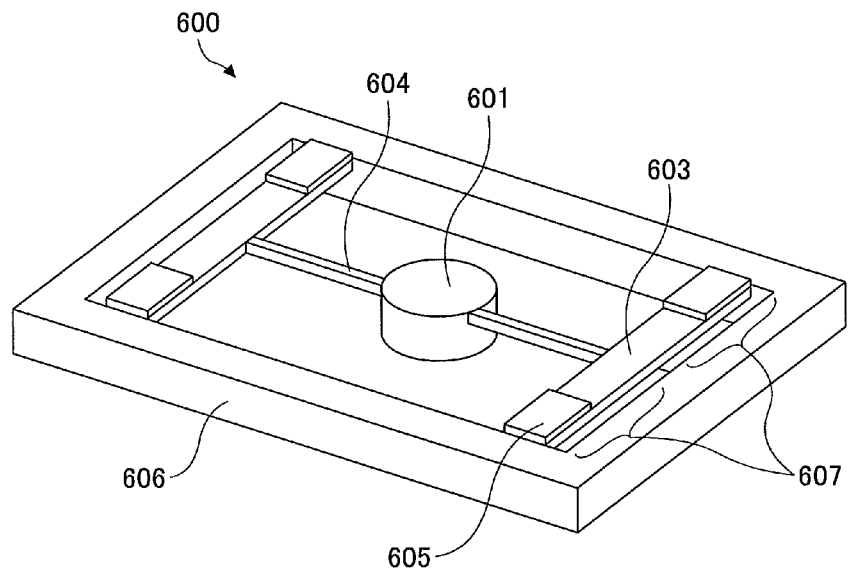
FIG. 9 is a perspective view illustrating an example of a deflecting mirror according to a third embodiment of the present invention.

As a third embodiment of the present invention, an example of a deflecting mirror including the electromechanical transducer film according to the first embodiment is described. FIG. 9 is a perspective view illustrating a piezoelectric MEMS (Micro Electro Mechanical Systems) mirror 600.

The piezoelectric MEMS mirror 600 includes a fixed base 606, a mirror unit 601 having a reflection surface, an elastic support member 604 that supports the mirror unit 601, a beam member 603 that supports the elastic support member 604 at two opposing sides, and an electromechanical transducer element 605 that is fixed to the beam member 603. The mirror unit 601 is vibrated when a voltage is applied to driving parts 607 to cause their deformation. By applying the electromechanical transducer film according to the first embodiment to the piezoelectric MEMS mirror 600, the performance of the piezoelectric MEMS mirror 600 may be improved.

Fourth Embodiment

Figure 10:
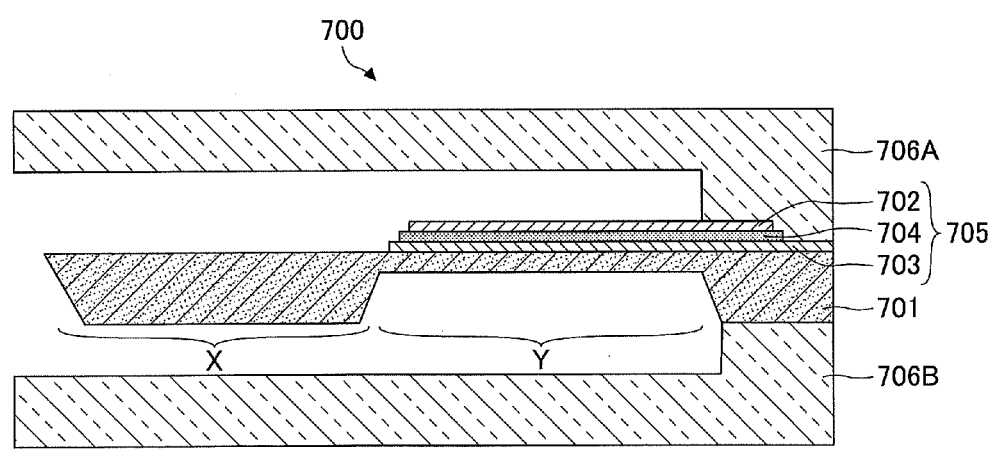
FIG. 10 is a cross-sectional view illustrating an example of an acceleration sensor according to a fourth embodiment of the present invention.

As a fourth embodiment of the present invention, an example of an acceleration sensor including the electromechanical transducer film according to the first embodiment is described. FIG. 10 is a cross-sectional view illustrating an acceleration sensor 700.

The acceleration sensor 700 includes a silicon substrate 701 having one side that has been subjected to anisotropic etching and including a thick portion X and a thin portion Y, glass substrates 706A and 706B that sandwich the silicon substrate 701, and an electromechanical transducer element 705 that is formed on the thin portion Y. The electromechanical transducer element 705 includes a upper electrode 702, an electromechanical transducer film 704, and a lower electrode 703. When acceleration is increased, the electromechanical transducer element 705 is deformed together with the thick portion X. The acceleration sensor 700 detects the acceleration by performing voltage conversion of the amount of displacement of the electromechanical transducer element 705. By applying the electromechanical transducer film according to the first embodiment to the acceleration sensor 700, the performance of the acceleration sensor 700 may be improved.

Fifth Embodiment

Figure 11:
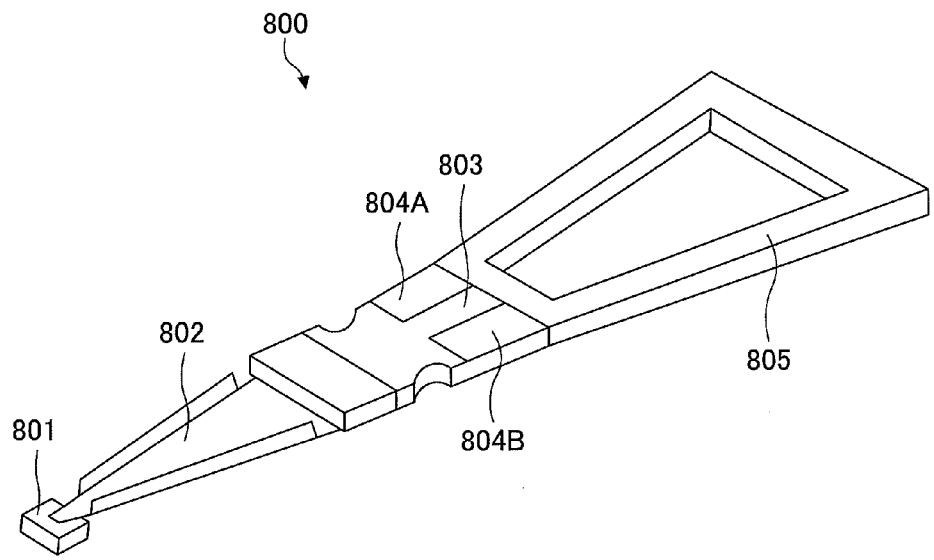
FIG. 11 is a perspective view illustrating an example of an HDD head fine adjustment device according to a fifth embodiment of the present invention.

As a fifth embodiment of the present invention, an example of a HDD (Hard Disk Drive) fine adjustment device including the electromechanical transducer film according to the first embodiment is described. FIG. 11 is a perspective view illustrating an HDD head fine adjustment device 800.

The HDD head fine adjustment device 800 includes a movable access arm 805, a head 801 that is attached to the tip of a support spring 802 via a central member 803, and electromechanical transducer elements 804A and 804B that are attached to the central member 803. The HDD head fine adjustment device 800 performs fine adjustment operations by alternatingly expanding and contracting the electromechanical transducer elements 804A and 804B to move the head 801 to a predetermined position on the HDD. By applying the electromechanical transducer film according to the first embodiment to HDD head fine adjustment device 800, the performance of the HDD head fine adjustment device 800 may be improved.

Sixth Embodiment

Figure 12:
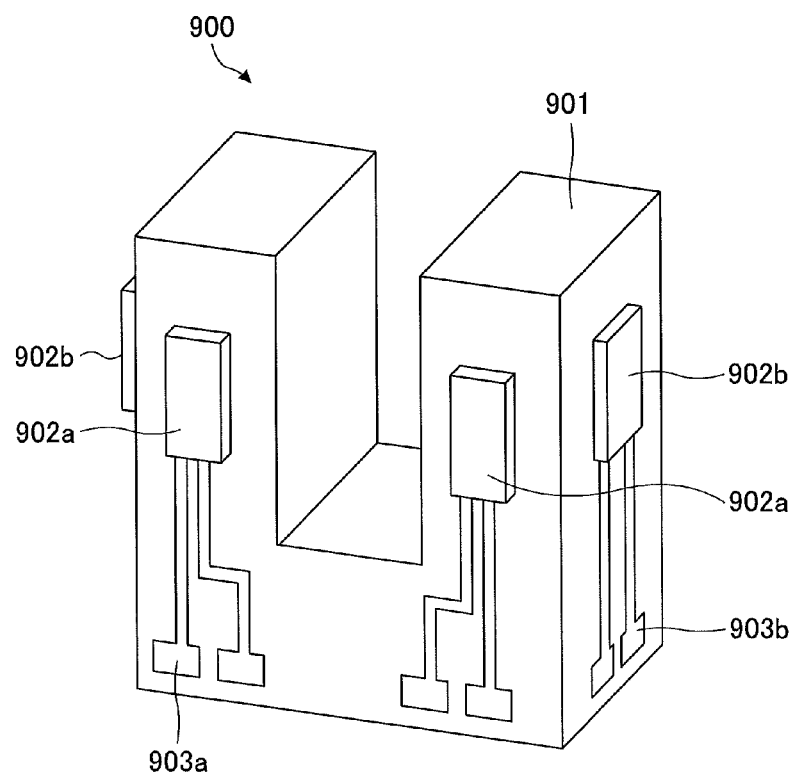
FIG. 12 is a perspective view illustrating an example of an angular velocity sensor according to a sixth embodiment of the present invention.

As a sixth embodiment of the present invention, an example of an angular velocity sensor including the electromechanical transducer film according to the first embodiment is described. FIG. 12 is a perspective view illustrating a vibration gyro type angular velocity sensor 900.

The vibration gyro type angular velocity sensor 900 includes a tuning fork 901 that is made of a material with a low thermal expansion coefficient, an electromechanical transducer element 902b for oscillation driving and an electromechanical transducer 902b for detection that are attached to the tuning fork 901, a pad 903a corresponding to the electromechanical transducer element 902a, and a pad 903b corresponding to the electromechanical transducer element 902b. The electromechanical transducer element 902a and the electromechanical transducer 902b are formed on vertical planes. The vibration gyro type angular velocity sensor 900 detects the vibrations of the electromechanical transducer elements 902a and 902b via the pads 903a and 903b, and detects an angular velocity based on the difference in their frequencies. By applying the electromechanical transducer film according to the first embodiment to the vibration gyro type angular velocity sensor 900, the performance of the angular velocity sensor 900 may be improved.

Seventh Embodiment

Figure 13:
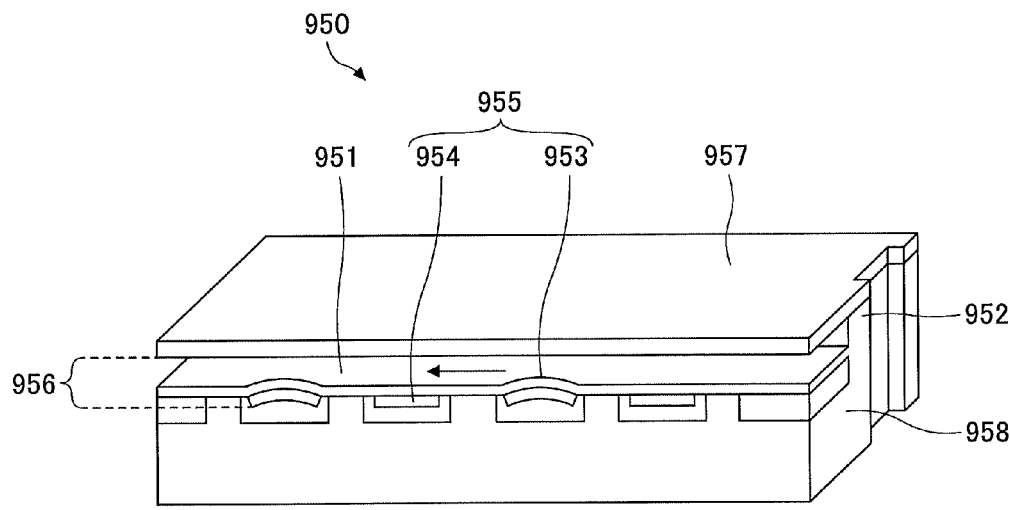
FIG. 13 is a perspective view illustrating an example of a micropump according to a seventh embodiment of the present invention.

As a seventh embodiment of the present invention, an example of a micropump including the electromechanical transducer film according to the first embodiment is described. FIG. 13 is a perspective view illustrating a micropump 950.

The micropump 950 includes a substrate 952 on which a flow path 951 is formed, a piezoelectric actuator 955 including an diaphragm plate 953 and an electromechanical transducer element 954 that is formed in tight contact with the diaphragm plate 953, a flow path forming substrate 956 on which a plurality of the piezoelectric actuators 955 are disposed, a cover substrate 957, and a protective substrate 958. The micropump 950 sequentially drives the diaphragm plates 953 in the direction of the arrow shown in FIG. 13 to repeat suction or discharge of fluid and transport the fluid within the flow path 951. By suitably designing the shape of a fluid inlet hole and a fluid outlet hole, or by arranging a valve at the flow path 951, the fluid transport efficiency may be improved. By applying the electromechanical transducer film according to the first embodiment to the micropump 950, the performance of the micropump 950 may be improved.

Eighth Embodiment

Figure 14:
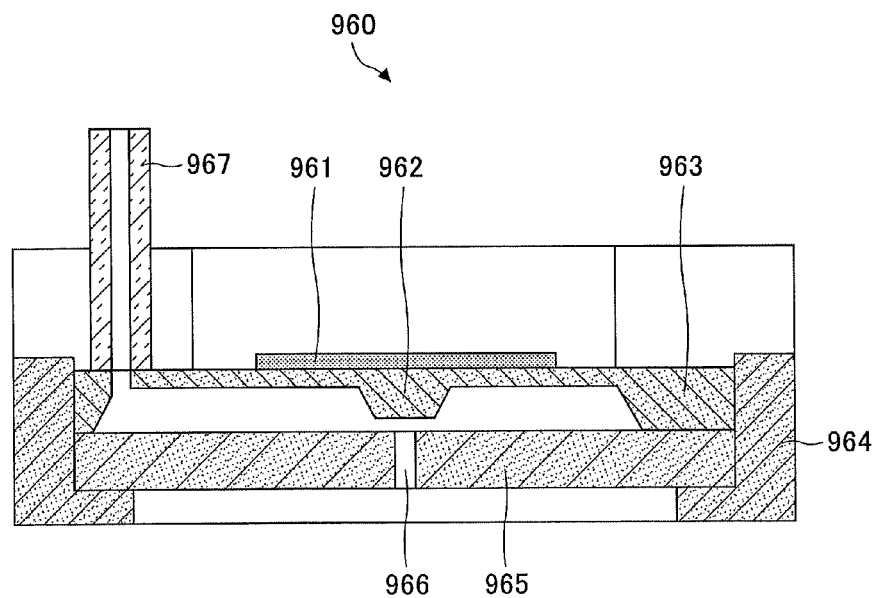
FIG. 14 is a cross-sectional view illustrating an example of a microvalve according to an eighth embodiment of the present invention.

As an eighth embodiment of the present invention, an example of a microvalve including the electromechanical transducer film according to the first embodiment is described. FIG. 14 is a cross-sectional view illustrating a microvalve 960.

The microvalve 960 includes a disk-shaped substrate 965 having a discharge outlet 966 at its central portion, a diaphragm 963 having a protruding portion 962 as a valve at its central portion, a fixing portion 964 for fixing the substrate 965 and the diaphragm 963, an electromechanical transducer element 961 that is formed on the diaphragm 963, and an inlet 967 into which fluid introduced. The microvalve 960 utilizes the vibration of the protruding portion 962 that is caused by the deformation of the electromechanical transducer element 961 to open/close the discharge port 966 and control the flow of fluid. By applying the electromechanical transducer film according to the first embodiment to microvalve 960, the performance of the microvalve 960 may be improved.

WORKING EXAMPLE

As working examples of the present invention, the precursor sol-gel solution, the functional ink, the electromechanical transducer film, and the electromechanical transducer element according to the first embodiment were actually fabricated.

Also, the moisture content of the fabricated precursor sol-gel solution was measured. Also, the stable discharge time of the fabricated functional ink was measured. Further, the discharge reliability of the inkjet head using the fabricated functional ink was investigated. Also, the electrical characteristics and the electromechanical conversion capacity of the fabricated electromechanical transducer element were evaluated. Note that lead zirconate titanate was used as the main component of the electromechanical transducer film.

[Synthesis of PZT Precursor Sol-Gel Solution]

Figure 15:
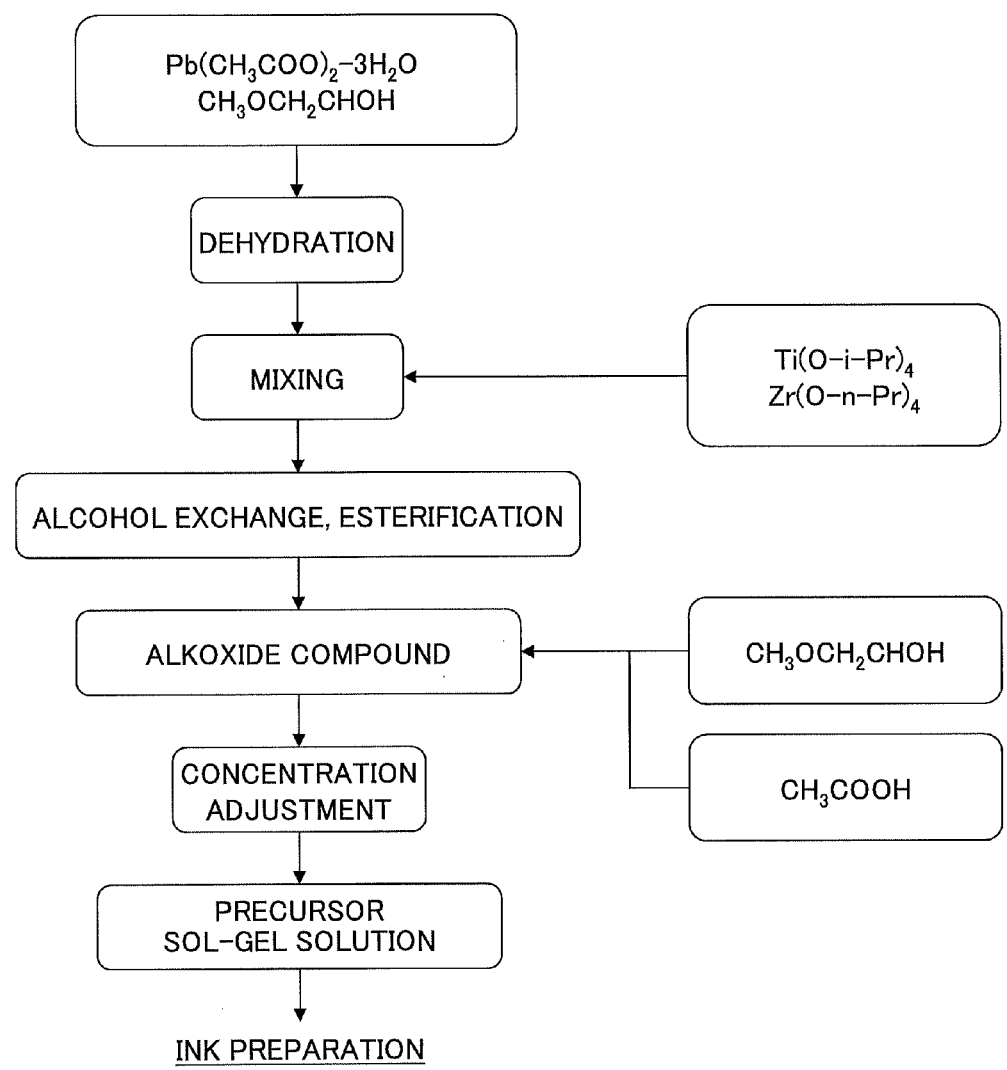
FIG. 15 illustrates an exemplary flow of synthesizing a precursor sol-gel solution.

In the following, synthesis of the PZT precursor sol-gel solution is described with reference to FIG. 15. In the present example, five samples of PZT precursor sol-gel solutions having different amounts of water added thereto were fabricated (see Table 1). The PZT precursor sol-gel solutions were labeled as Samples A-E. Sample A, Sample B, and Sample C were used as working examples of the present invention. Sample D and Sample E were used as comparative examples.

TABLE 1

| | MOISTURE [MOLAR RATIO] |
|---|---|
| SAMPLE A | 0.59 |
| SAMPLE B | 0.72 |
| SAMPLE C | 1.0 |
| SAMPLE D | 0.37 |
| SAMPLE E | 0.48 |

First, starting materials were prepared. As the starting materials, lead acetate trihydrate ($Pb(CH_3COO)_2 3H_2O$), zirconium tetra-n-propoxide $Zr(OCH_2CH_2CH_3)_4$, titanium tetra isopropoxide $Ti(OCH(CH_3)_2)_4$ were used.

Then, these starting materials were weighed so that the amount of lead would be 20 mol % in excess with respect to the stoichiometric composition $Pb(Zr_{0.53},Ti_{0.47})O_3$. That is, the starting materials were weighed to achieve the composition $Pb_{1.20}(Zr_{0.53},Ti_{0.47})O_3$.

Then, lead acetate trihydrate was dissolved in 2-methoxy ethanol ($CH_2OCH_2CH_2OH$) to create a lead acetate 2-methoxy ethanol solution.

Then, the lead acetate 2-methoxy ethanol solution was heated to the boiling point (124° C.) of the solvent (2-methoxy ethanol), after which reflux, dehydration of the lead acetate trihydrate, and alcohol exchange of the lead acetate were carried out. After the solvent has reached the boiling point (124° C.), all five of the solutions were maintained at this temperature for 12 hours to promote the alcohol exchange reaction.

Then, for each solution, zirconium tetra-n-propoxide and titanium tetraisopropoxide were introduced, and the solutions were heated again to the boiling point of the solvent (124° C.), after which reflux, lead acetate alcohol exchange reactions, and esterification reactions were promoted. After the solvent has reached the boiling point (124° C.), all five of the solutions were maintained at this temperature for 12 hours.

Then, for each solution, a small amount of acetic acid was added and a stabilization process was performed. By adding acetic acid, decomposition of the alkoxide compound produced by the alcohol exchange reaction (e.g. lead alkoxide) by moisture or the like may be prevented. Note that acetylacetone, diethanolamine, or the like may be added as a stabilizer.

Then, for each solution, 2-methoxyethanol was mixed and concentration adjustment was performed. The concentration adjustment was performed such that the concentration of solids consisting of polymers would be 0.5 mol/liter.

Then, water was added to these solutions, and the solutions were stirred for 30 minutes (partial hydrolysis). The amounts of water added to the five solutions were varied, and PZT precursor sol-gel solutions were synthesized from these solutions. Note that in the partial hydrolysis process, the substance added to the PZT sol-gel precursor solution is not limited to water. For example, an aqueous solution containing a substance dissolved in water may be used. Also, the viscosity change before and after the partial hydrolysis process was less than or equal to 50% in each of the Samples A-E.

In this manner, PZT precursor sol-gel solutions were synthesized to fabricate the five samples of PZT precursor sol-gel solutions (Samples A-E).

[Measurement of Moisture Content of PZT Precursor Sol-Gel Solution]

Then, the moisture content of the synthesized precursor sol-gel solutions (Samples A-E) was measured. In the present example, the moisture content of the Samples A-E was measured using a Karl Fischer moisture meter.

Table 1 shows the moisture content of each of the precursor sol-gel solutions corresponding to Samples A-E converted into a molar ratio with respect to the B site atoms contained in the precursor sol-gel solution. An example of such a conversion is described below. The measurement result of the moisture content of Sample A was 0.48 wt %. Because the sol-gel precursor solution had a density of 1.11 g/cm$^3$, the moisture content could be calculated as 0.30 mol/liter. The B site atoms of this precursor sol-gel solution included titanium and zirconium, and the sum of their content within the precursor solution was 0.5 mol/liter. Thus, the molar ratio of the moisture content with respect to the B site atoms was calculated as 0.59 times. Note that similar conversions were performed for the other samples.

In Sample A, the moisture content of the PZT precursor sol-gel solution was 0.59 times. In sample B, the moisture content of the PZT precursor sol-gel solution was 0.72 times. In sample C, the moisture content of the PZT precursor sol-gel solution was 1.0 times. In sample D, the moisture content of the PZT precursor sol-gel solution was 0.37 times. In sample E, the moisture content of the PZT precursor sol-gel solution was 0.48 times.

That is, in Sample A, Sample B, and Sample C, the moisture content of the PZT precursor sol-gel solution was within a range greater than equal to 0.5 times and less than or equal to 10 times the B site atoms content. On the other hand, in Sample D and Sample E, the moisture content of the PZT precursor sol-gel solution was less than 0.5 times the B site atoms content.

It could be appreciated from the above that by appropriately controlling the amount of water to be added to a solution after performing concentration adjustment by mixing 2-methoxy ethanol to the solution, the moisture content of the precursor sol-gel solution may be controlled.

[Ink Preparation of PZT Precursor Sol-Gel Solution]

Then, ink preparation was performed with respect to the five PZT precursor sol-gel solutions (Samples A-E). For each PZT precursor sol-gel solution, a primary solvent and a secondary solvent were added, and the concentration of solids dispersed in the solution was adjusted to fabricate the functional ink to be used in the inkjet head 69. The functional inks fabricated from the five PZT precursor solutions corresponding to Samples A-E were respectively labeled as Samples 1-5 (see Table 2). Sample 1, Sample 2, Sample 3 were used as working examples of the present invention. Sample 4 and Sample 5 were used as comparative examples.

TABLE 2

| | STABLE DISCHARGE TIME [sec] |
|---|---|
| SAMPLE 1 | 180 |
| SAMPLE 2 | 600 |
| SAMPLE 3 | AT LEAST 600 |
| SAMPLE 4 | 40 |
| SAMPLE 5 | 40 |

Specifically, 2-methoxyethanol (CH$_2$OCH$_2$CH$_2$OH) and 1-nonanol (CH$_3$(CH$_2$)$_8$OH) were added to each of the Samples A-E and the resulting solution was stirred. Note that 2-methoxy ethanol was used as the primary solvent and 1-nonanol was used as the secondary solvent. Concentration adjustment was performed such that the volume ratio of the primary solvent to the secondary solvent would be 1:1 and the concentration of solids dispersed in the functional ink would be 0.25 mol/liter.

1-nonanol has good compatibility with each of the precursor sol-gel solutions and has a boiling point of 215° C., which is higher than the boiling point of 2-methoxy ethanol (124° C.). For this reason, 1-nonanol was selected as the secondary solvent.

Note that upon performing the ink preparation, factors such as the drying speed, the viscosity, the surface tension, and the boiling point of each sample are preferably taken into consideration.

[Application of Functional Ink]

Then, using the inkjet method, the fabricated functional ink was applied to the hydrophilic region of a substrate. That is, a surface treatment was performed on a lower electrode of the substrate to divide the surface of the lower electrode into a hydrophilic region and a hydrophobic region, and in this way, the functional ink was only applied to the hydrophilic region.

First, a titanium dioxide film (with a thickness of 50 nm) was formed by sputtering on a silicon wafer as an adhesion layer. Then, as the lower electrode layer, a laminated film including a platinum film (with a thickness of 50 nm) and a strontium ruthenium oxide film (with a thickness of 60 nm) was formed by sputtering.

Then, a photoresist layer was spin-coated on the lower electrode layer, and a resist pattern was formed by patterning the photoresist layer by photolithography. Then, the strontium ruthenium oxide film that does not overlap with the resist pattern was removed by dry etching. Next, the resist pattern was removed, and in this way, a lower electrode having a strontium ruthenium oxide film with a predetermined pattern formed on a platinum film was formed.

The resist pattern was formed to have a plurality of rectangular shapes with a short side length of 45 μm and a long side length of 1000 μm. The space between adjacent rectangles was arranged to be 45 μm, and the line to space ratio was arranged to be 1:1.

Then, the silicon wafer having the lower electrode formed thereon was immersed in an alkanethiol diluent for 10 seconds and was subjected to an SAM process thereafter. The silicon wafer that was subjected to the SAM process was immersed in an ethanol solution and was subjected to ultrasonic cleaning for 5 minutes to have an SAM film formed on the platinum film surface. Note that dodecanethiol CH$_3$(CH$_2$)$_{11}$—SH was used as the alkanethiol diluent, and its concentration was arranged to be 0.1 mmol/liter (solvent: ethanol).

After the SAM process, the pure water contact angle in the region where the SAM film was formed was measured to be greater than or equal to 100° thereby indicating that this region corresponds to a hydrophobic region. On the other hand, in the region where the strontium ruthenium oxide film was formed, the pure water contact angle was measured to be less than or equal to 40° thereby indicating that this region corresponds to a hydrophilic region. It could be appreciated from these results that the SAM process was properly performed and the surface of the lower electrode was divided into a hydrophobic region and a hydrophilic region having a high contrast in their contact angles.

Then, using the inkjet method, each of the functional inks (Samples 1-3) was discharged from an inkjet head onto the hydrophilic region (where the strontium ruthenium oxide film was formed). The functional ink moistened and spread across the hydrophilic region to form a functional ink film.

Then, a heat treatment was performed on the functional ink film. That is, the silicon wafer was placed on a hot plate and a first heat treatment was performed from a bottom face of the silicon wafer. The temperature was raised from room temperature to 120° C. at a temperature increase rate of 30° C./min. Even after the temperature of the hot plate reached 120° C., the heat treatment was continued until the functional ink film became dry. Then, the dried functional ink film was subjected to a second heat treatment. That is, a heat treatment at 500° C. was performed to promote thermal decomposition of organic matter contained in the dried functional ink film. The SAM film disappeared as a result of performing such a heat treatment, and a heat-treated functional ink layer (with a central portion having a film thickness of 80 nm) was formed.

Then, the silicon wafer having the heat-treated functional ink film formed thereon was washed with isopropyl alcohol, immersed in the alkanethiol diluent for 10 seconds, and was subjected to the SAM process again. Then, the silicon wafer that has undergone the SAM process was immersed in an ethanol solution and subjected to ultrasonic cleaning for 5 minutes to have a SAM film formed on the platinum film surface. After the SAM process, the pure water contact angle in the region where the heat-treated functional ink film was formed was measured to be less than or equal to 25° thereby indicating that this region corresponds to a hydrophilic region.

Then, using the inkjet method, the functional ink was discharged once again from the inkjet head onto the hydrophilic region (region where the heat-treated functional ink film was formed). The functional ink moistened and spread across the hydrophilic region again to form a functional ink film.

Then, a heat treatment was performed again on the functional ink film. The silicon wafer was placed on a hot plate, and the first heat treatment was performed from the bottom surface of the silicon wafer. The temperature was raised from room temperature to 120° C. at a temperature increase rate of 30° C./min. Then, the second heat treatment was performed on the dried functional ink film. That is, a heat treatment at 500° C. was performed to promote thermal decomposition of the organic matter contained in the dried functional ink film. Further, a third heat treatment (crystallization treatment) was performed. That is, using a high-speed heat treatment apparatus, a rapid heat treatment at 750° C. was performed to promote crystallization of the heat-treated functional ink film (the functional ink film that was recoated).

Then, the same cycle of process steps including the SAM process, the application of the functional ink, the heat treatment, the SAM treatment, the application of the functional ink, the heat treatment, and the crystallization process was executed 15 times under the same conditions. That is, the application of the functional ink was repeated 30 times. In this way, the electromechanical transducer film having a predetermined thickness (PZT film) was formed.

[Discharge Reliability of Inkjet Head]

Then, the discharge reliability of the inkjet head was investigated based on the state of the liquid droplets (functional ink) discharged from the nozzle of the inkjet head, the stable discharge time of the liquid droplets, and the landing pattern of the electromechanical transducer film (PZT film).

Table 2 indicates the stable discharge time that is correlated with the discharge reliability of the inkjet head. In the present description, stable discharge time refers to the time during which stable discharge of liquid droplets without a change in the flying behavior of the liquid droplets continues. It is presumed that the longer the stable discharge time, the higher the discharge reliability of the inkjet head.

Figure 16:
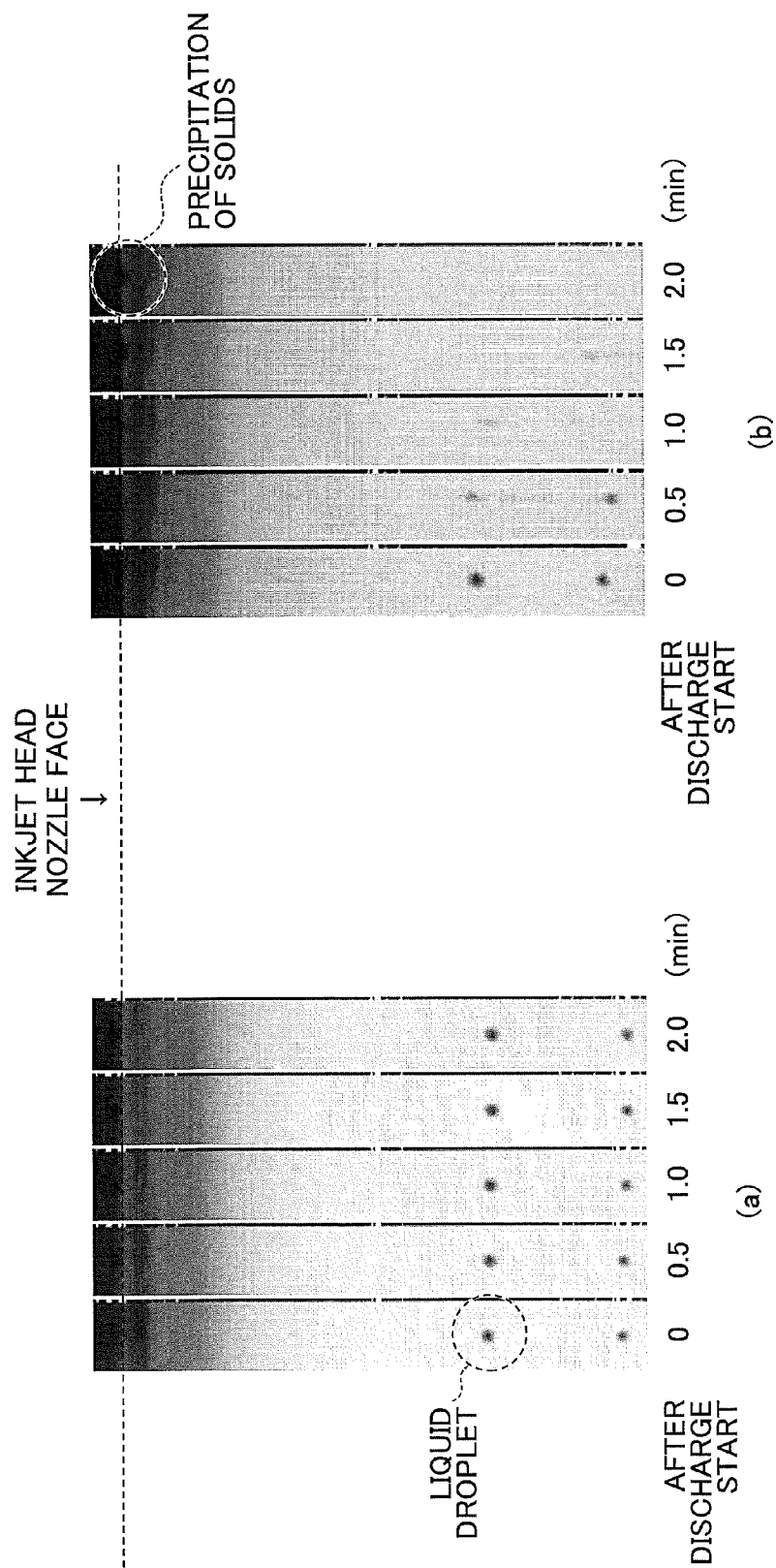
FIG. 16 is a stroboscopic photograph capturing a state of liquid droplets.

In the following, a measurement example of the stable discharge time is described. FIG. 16 is a stroboscopic photograph capturing a state of liquid droplets.

That is, an image of the state of liquid droplets being discharged from the nozzle of the inkjet head approximately several thousands of times per second was captured every 0.5 minutes during a time period from 0 minutes to 2 minutes from the discharge start time. The humidity of the environment was 50%.

FIG. 16 (a) illustrates a state of the liquid droplets when Sample 3 was used as the functional ink. FIG. 16 (b) illustrates a state of the liquid droplets when Sample 4 was used as the functional ink. It can be appreciated from FIG. 16 (a) that the functional ink using Sample 3 could be stably discharged immediately after the discharge start time and the stable discharge performance could be maintained over time such that the stable discharge time was greater than or equal to 2 minutes.

On the other hand, it can be appreciated from FIG. 16 (b) that the functional ink using Sample 4 could only be stably discharged immediately after the discharge start time and the discharge performance deteriorated and became unstable over time. That is, over time, solid precipitation occurred around the periphery of the nozzle discharging the liquid droplets, the flying speed of the liquid droplets was increased, and liquid droplet deflection occurred. As a result, the stable discharge time was less than or equal to 1 minute and the discharge reliability was low. Note that the stable discharge time was measured for each of the functional inks described above.

In Sample 1, the stable discharge time of the functional ink was 180 seconds. In Sample 2, the stable discharge time of functional ink was 600 seconds. In Sample 3, stable discharge time of the functional ink was at least 600 seconds. In Sample 4, the stable discharge time of functional ink was 40 seconds. In Sample 5, the stable discharge time of the functional ink was 40 seconds. Note that the humidity of the environment was 50%.

As can be appreciated, the functional ink stable discharge time of Sample 1, Sample 2, and Sample 3 was comparatively longer than the functional ink stable discharge time of Sample 4 and Sample 5. Also, the functional ink stable discharge time of Sample 3 was the longest among the Samples 1-5. Note that a functional ink using a PZT precursor sol-gel solution with a moisture content that is greater than 10 times the B site atom content (not listed as a comparative example sample in the present example) was not practical in view of storage stability issues.

In other words, provided the moisture content of a PZT precursor sol-gel solution is within a range greater than or equal to 0.50 times and less than or equal to 10 times the B site atom content, the greater the moisture content, the longer the stable discharge time and the higher the discharge reliability of the inkjet head.

Note that the stable discharge time may vary depending on the environment such as humidity. In an environment of a typical cleanroom in which the humidity is 40-60%, the moisture content of the PZT precursor sol-gel solution is preferably at least 0.50 times the B site atom content.

Also, the required stable discharge time may vary depending on factors such as the functional ink application area and maintainability of the nozzle of the inkjet head, for example. In a case where the functional ink application area is relatively large and simplification of nozzle maintenance features is desired, the moisture content of the PZT precursor sol-gel solution is preferably greater than or equal to 1.0 times the B site atom content.

Figure 17:
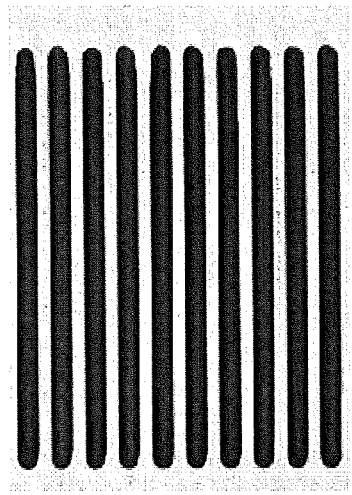
FIG. 17 is a photograph showing an electromechanical transducer film fabricated in a working example.
Figure 18:
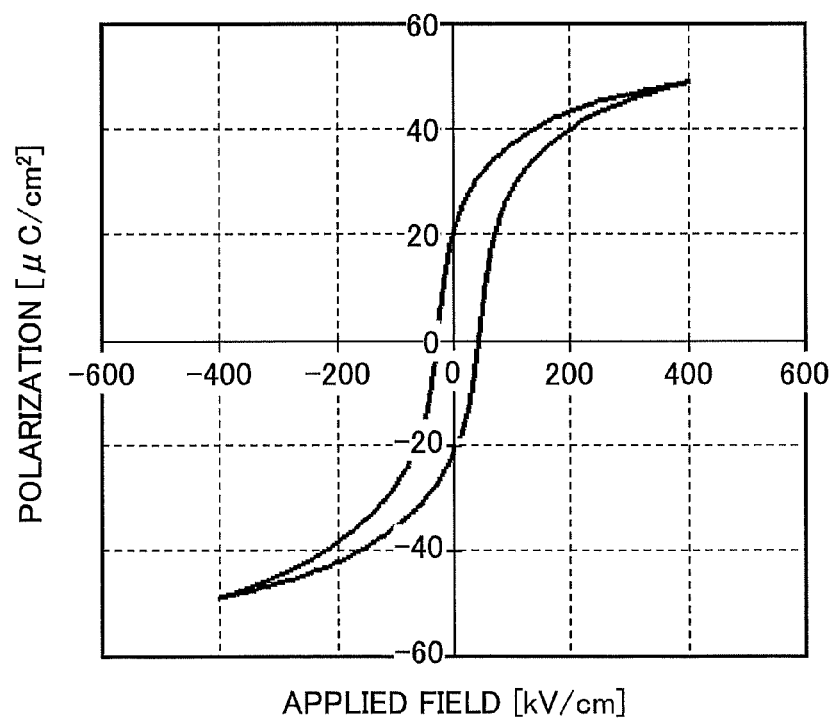
FIG. 18 is a graph illustrating a P-E hysteresis curve of the electromechanical transducer element fabricated in the working example.

FIG. 17 is a photograph capturing a state of a landing pattern of a PZT film. Note that FIG. 17 represents the landing pattern of a PZT film formed using Sample 1, Sample 2, or Sample 3.

As can be appreciated from FIG. 17, liquid droplets (functional ink) discharged from the inkjet head land accurately on a predetermined pattern to form a PZT film having a desired shape.

Further, the thickness of the PZT film was measured using a contact-type thickness meter. The PZT film had a film thickness of 1.8 μm, the thickness variations between patterns was within 2.5%, and the thickness variation between a central portion and a peripheral portion of a pattern was less than ±0.5%, thereby indicating that a PZT film with a desirable shape could be obtained. It could be appreciated from the above that in the PZT films formed using Samples 1-3, both inter-pattern and intra-pattern thickness variations may be desirably small such that the so-called coffee stain effect may be suppressed.

That is, by using a PZT precursor sol-gel solution with a moisture content within a range greater than or equal to 0.50 times and less than or equal to 10 times the B site atoms content as the functional ink, the discharge reliability of the inkjet head may be improved and an electromechanical transducer film with a desirably high quality may be fabricated.

[Evaluation of Electrical Characteristics and Electromechanical Conversion Capacity]

Then, an upper electrode (platinum) was formed on the high-quality PZT film to fabricate an electromechanical transducer element, and evaluation of the electrical characteristics and the electromechanical conversion capacity (piezoelectric constant) was performed.

The evaluation results indicated that the dielectric constant was 1500, the dielectric loss was 0.05, and the breakdown voltage was 50 V. It can be appreciated from the above that the electromechanical transducer element has excellent electrical characteristics.

FIG. 20 illustrates a P-E hysteresis curve of the electromechanical transducer element fabricated in the present example. Note that the residual polarization of the electromechanical transducer element was 12 [μC/cm$^2$] and the coercive electric field was 28 [kV/cm]. Thus, it could be appreciated that the electromechanical transducer element has substantially the same characteristics as a regular ceramic sintered body. Also, the electromechanical conversion capacity (piezoelectric constant) was evaluated by measuring the amount of deformation caused by application of an electric field using a laser Doppler vibrometer and calibrating the measurement result with simulation results. The obtained piezoelectric constant (d31) of the electromechanical transducer element was 142 pm/V. Thus, it could be appreciated that the electromechanical transducer element has substantially the same electromechanical conversion capacity (piezoelectric constant) as that of a regular ceramic sintered body. The characteristics values indicate that the electromechanical transducer element can be suitably designed to be used in a liquid droplet discharge head.

It can be appreciated from the above that an electromechanical transducer element that is fabricated using a high-quality electromechanical transducer film may have desirable device characteristics.

Although the present invention has been described above with reference to certain illustrative embodiments, the present invention is not limited to these embodiments, and numerous variations and modifications may be made without departing from the scope of the present invention.

What is claimed is:

1. A functional ink comprising:
a precursor sol-gel solution used for forming an oxide dielectric film having a perovskite structure represented by a general formula $ABO_3$; and
a solvent,
wherein the precursor sol-gel solution has been subjected to a partial hydrolysis process in which a viscosity change resulting from the partial hydrolysis process is controlled to be less than or equal to 50%, and water contained in the precursor sol-gel solution is controlled to be greater than or equal to 0.50 times and less than or equal to 10 times by molar ratio with respect to a B site atom contained in the precursor sol-gel solution, and
wherein the functional ink has a metal oxide concentration and a viscosity that renders the functional ink suitable for being discharged from a nozzle of a liquid droplet discharge apparatus included in a thin film fabrication apparatus.

2. The functional ink as claimed in claim 1, further comprising:
an A site atom corresponding to lead (Pb) and the B site atom corresponding to at least one of zirconium (Zr) and titanium (Ti).

3. The functional ink as claimed in claim 1, wherein a concentration of solids dispersed in the functional ink is 0.25 mol/liter.

4. An electromechanical transducer film used in an inkjet head, the electromechanical transducer film being fabricated by a cycle of processes using the functional ink as claimed in claim 1.

5. The electromechanical transducer film as claimed in claim 4, wherein the cycle of processes includes
a self-assembled monolayer formation process;
an ink application process;
a heat treatment process; and
a crystallization process, wherein the above processes are repeated a plurality of times.

* * * * *